United States Patent [19]

Sekiguchi et al.

[11] 4,284,937
[45] Aug. 18, 1981

[54] LOAD CURRENT DETECTING APPARATUS OF DIRECT CURRENT MOTORS

[75] Inventors: Kunio Sekiguchi, Kawagoe; Masaharu Noguti, Tokyo, both of Japan

[73] Assignee: Tokyo Shibaura Denki Kabushiki Kaisha, Kanagawa, Japan

[21] Appl. No.: 85,672

[22] Filed: Oct. 17, 1979

[30] Foreign Application Priority Data

Oct. 25, 1978 [JP] Japan ................................. 53-130420

[51] Int. Cl.³ .......................... H02P 1/02; H02P 5/16
[52] U.S. Cl. ..................................... 318/388; 318/394
[58] Field of Search ............... 318/615, 387, 388, 390, 318/389, 430, 394, 395, 331

[56] References Cited

U.S. PATENT DOCUMENTS

| | | | |
|---|---|---|---|
| 3,359,477 | 12/1967 | Wasai et al. | 318/262 |
| 3,366,856 | 1/1968 | Sawano | 318/615 |
| 3,394,294 | 7/1968 | Leroi et al. | 318/615 |
| 3,614,569 | 10/1971 | Reinert | 318/332 |
| 3,617,844 | 11/1971 | Grygera | 318/331 |
| 3,814,310 | 6/1974 | Safiuddin et al. | 318/6 |

*Primary Examiner*—David Smith, Jr.
*Attorney, Agent, or Firm*—Stevens, Davis, Miller & Mosher

[57] ABSTRACT

In a load current detecting apparatus of a DC motor for driving a mill stand and utilized to maintain a predetermined interstand tension, a simulating circuit is provided to remove the effect of acceleration or deceleration current and moment of inertia of the motor.

4 Claims, 5 Drawing Figures

LOAD CURRENT DETECTING APPARATUS OF DIRECT CURRENT MOTORS

BACKGROUND OF THE INVENTION

This invention relates to load current detecting apparatus of a direct current (DC) motor, more particularly apparatus for detecting effective load driving current (hereinafter merely called load current) which is equal to the difference between the armature current of the motor and the current necessary to accelerate or decelerate the motor.

In the operation of a hot strip mill or a tandem rolling mill of rolling shaped steel stocks, bar or wire shaped steel stocks, the shape and dimension of the products are often influenced by the variation in the interstand tension developed in the material being rolled. To eliminate such variation in the interstand tension, a looper control has been used. In the case of a hot strip mill, however, as the material being rolled is thick or as the shape is complicated, the looper control cannot be used. In such a case, so-called free tension control is used wherein the variation in the interstand tension is detected by detecting the variation of the torque of a mill driving DC motor.

FIG. 1 of the accompanying drawing shows one example of a free tension control device applied to a two stand tandem mill which comprises mill stands 1 and 2 respectively driven by DC motors 3 and 4, the speeds thereof being controlled by speed controllers 7 and 8.

The speed references of these two mill stands are given by speed ratio setters 11 and 12 which set the speed ratio of these stands, and a main speed setter 13 which sets the line speed. In the first mill stand, the speed controller 7 controls the speed of motor 3 such that the result of comparison of a speed reference $NR_1$ and the output $NF_1$ of the speed detector 5 which detects the speed of the motor made by a comparator 9 would be zero.

In the same manner, in the second stand, the speed controller 8 controls the speed of the motor 4 such that the result of comparison of a speed reference $NR_2$ and the output $NF_2$ of the speed detector 6 made by a comparator 10 would be zero.

The free tension control device 17 is constructed to calculate a speed correction quantity $\Delta N_1$ by using the rolling force $P_1$ of the first stand detected by a load cell 14, the armature current $I_1$ of the motor 3 detected by a current detector 15, the terminal voltage $V_1$ of the motor 3 detected by a voltage detector 16 and the speed $NF_1$ of the motor 3 detected by the speed detector 5. The speed correction quantity $\Delta N_1$ is applied to comparator 9 (which also acts as an adder or subtractor) to control the speed of the motor 3 for controlling the interstand tension between the first and second stands.

The free tension control device 17 operates according to the following principle.

In a rolling mill for rolling steel plate or the like the following equation holds between the rolling load P and the rolling torque G.

$$G/P = a \quad (1)$$

The term a is generally termed a torque arm and is constant regardless of variation in the deformation resistance of the material.

In a case of a hot rolling mill, variation in the rolling force with reference to the variation in the tension applied to the material is generally much smaller than the variation in the rolling torque.

The free tension control is performed by utilizing the relationships described above. More particularly, the torque $\Delta Gt_1$ caused by the tension between the first and second stands is expressed by the following equation (2):

$$\Delta Gt_1 = \frac{G_{01}}{P_{01}} P_1 - G_1 \quad (2)$$

where $P_{01}$ represents the rolling force of the first stand under no tension condition during an interval in which the material 18 enters into the first stand and then reaches the second stand, $G_{01}$ the rolling torque, $P_1$ and $P_2$ respectively represent the rolling force and the rolling torque after the material has entered into the second stand. In this case the rolling force represents a value detected by the load cell 14, and the rolling torque is calculated by the following equation:

$$G_1 = k_1 \frac{V_1 - I_1 R_1 - L_1 \frac{dI}{dt}}{NF_1} \quad (3)$$

where
$k_1$: constant
$R_1$: armature resistance
$L_1$: armature reactance.

The speed of the first stand is corrected such that the tension torque $\Delta G_1$ calculated by equation (2) will reach a certain target tension torque. The amount of speed correction $\Delta N_1$ can be determined by the following equation:

$$\Delta N_1 = g_1(G_{t01} - \Delta G_{t1}) \quad (4)$$

where
$g_1$: constant
$G_{t01}$: target interstand tension between the first and second stands.

Under a steady rolling condition, should the tension varies so as to apply to the comparator 19 a first stand speed correction quantity $\Delta N_1$ obtained by equation (1), the speed of the motor 3 would vary. At this time acceleration (or deceleration) current is flowing through the motor. $\Delta G_{t1}$ obtained by substituting into equation (2) the torque $G_1$ according to equation (3) under these conditions does not represent correct tension torque. In a tandem mill in which the line speed can be varied to any desired value by the main speed setter 13, the value of $\Delta t_1$ obtained by using current I containing the acceleration or deceleration current does not represent the correct tension torque. To solve this problem, according to a prior art method, the torque $\Delta G_{t1}$ has been determined by the following equation (5) by taking into consideration the acceleration or deceleration torque $G_{al}$.

$$\Delta G_{t1} = \frac{G_{01}}{P_{01}} P_1 - G_1 - G_{al} \quad (5)$$

$$G_{al} = g_2 \cdot GD^2 \cdot \frac{dNF_1}{dt} \quad (6)$$

where $GD^2$: total $GD^2$ of the rotating portion of the motor and the load thereof $g_2$: constant.

However, since the acceleration of a DC motor lags, at the time of starting and completion of acceleration (or deceleration) phases of the acceleration (or deceleration) current and the acceleration (or deceleration) torque calculated by equation (6) are not equal so that at these points, even with equation (5) correct tension would not be obtained.

According to another method, sampling control is effected for an acceleration (or deceleration) caused by the speed correction quantity $\Delta N_1$ and the next $\Delta G_{t1}$ is not calculated untill speed correction is completed. This results in a coarser sampling pitch so that it is impossible to sufficiently increase the response speed of the free tension control.

As above described the most serious problem of the free tension control lies in the control of acceleration and deceleration, and the present invention contemplates solution of this problem.

As above described, the armature current I equals to the sum of the acceleration (or deceleration) current and the load current. Thus:

$$I = I_R + I_a \qquad (7)$$

where $I_R$: load current $I_a$: acceleration (or deceleration) current.

The factor which is necessary to calculate the rolling torque is the current $I_R$ corresponding to the load torque. Accordingly when $I_1$ (FIG. 1) is substituted by $I_{R1}$ a correct free tension control can be realized. Thus, according to this invention, there is provided apparatus for detecting load current $I_R$ obtained by subtracting the acceleration (or deceleration) current Ia from the armature current.

As shown in equation (6), the factors that determine the acceleration or deceleration torque are the moment of inertia $GD^2$ and the rate of acceleration (or deceleration) $dN/dt$.

SUMMARY OF THE INVENTION

Accordingly, it is an object of this invention to provide an improved load current detecting apparatus suitable for use to control interstand tension of a multistand rolling mill which is not affected by acceleration or deceleration current or the moment of inertia of the load.

According to this invention there is provided a load current detecting apparatus of a direct current motor, characterized in that there is provided a simulation circuit manifesting a control characteristic of no load running of the motor, that the characteristic includes moment of inertia of a load of the motor and that signals representing actual armature current, armature voltage and speed of the motor are applied to the simulation circuit so as to produce an effective load driving armature current which does not contain acceleration or deceleration current of the motor.

DESCRIPTION OF THE PREFERRED EMBODIMENTS

Figure 2:
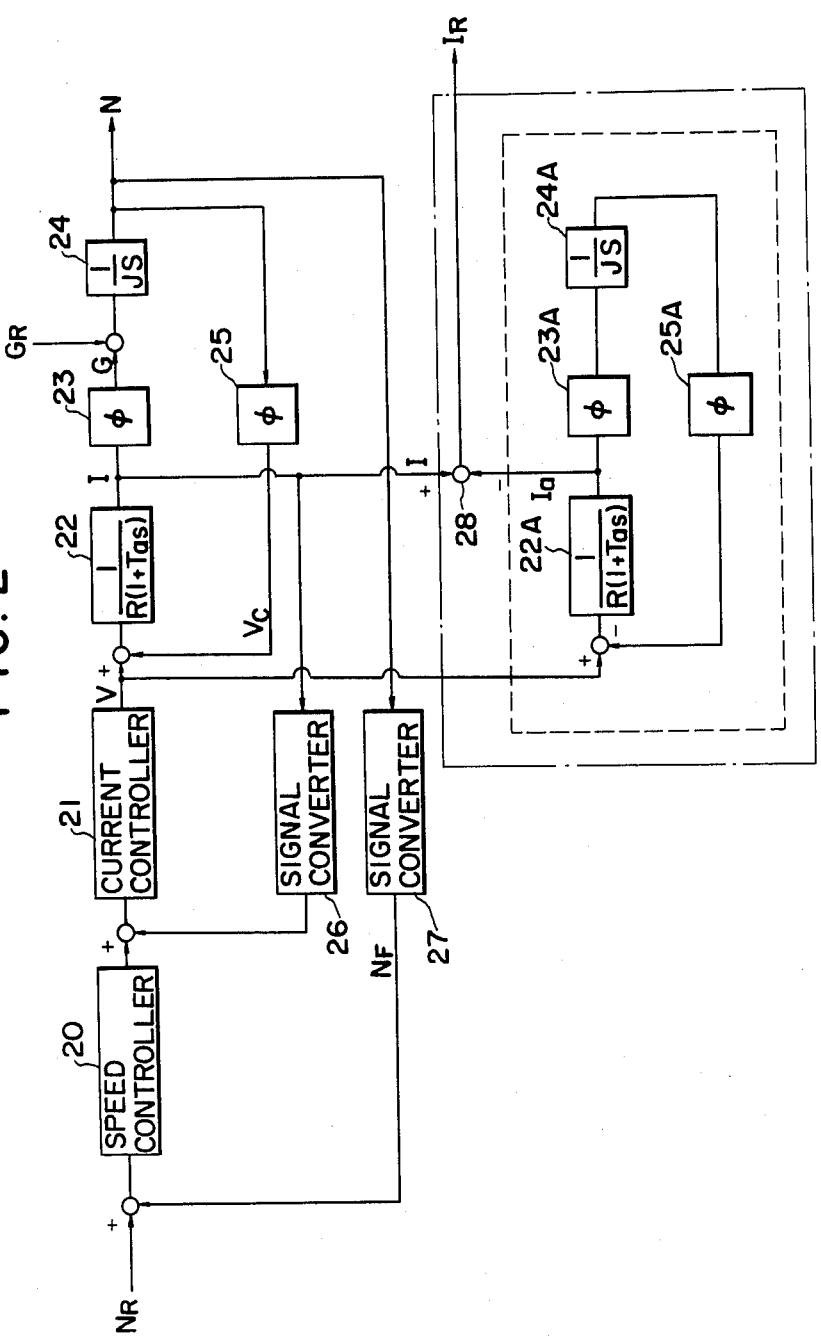
FIG. 2 is a block diagram showing a preferred embodiment of this invention.

The load current detecting apparatus shown in FIG. 2 comprises a speed controller 20, a current controller 21 and an armature circuit 22 of a DC motor. Magnetic flux $\Phi$ is represented by blocks 23 and 25 respectively which act as a torque coefficient and a counterelectromotive force coefficient. However, since these coefficients are substantially the same, the sum of them are termed herein as the counterelectromotive force coefficient. J in a block 24 represents the moment of inertia of the rotating portion of motor and the roll, and reference characters 26 and 27 represent signal converters, $N_R$ a speed reference, $N_F$ a feedback signal, V the terminal voltage of the motor, $V_c$ the backelectromotive force, I the armature current, R the armature resistance, Ta the time constant of the armature circuit, G the torque generated by the motor, $G_R$ the load torque and S the Laplace operator. Then the following relationships hold.

$$V_c = k_2 \Phi N \qquad (8)$$

$$G = k_3 \Phi I \qquad (9)$$

where $k_2$ and $k_3$ are constants.

As above described, the armature current I equals the sum of the load current $I_R$ corresponding to the load torque $G_R$ and the acceleration (or deceleration) current $I_a$ caused by the variation in the speed reference $N_R$.

The load current detector embodying the invention is shown in a dotted line block containing a simulation circuit of the speed control system of the motor. The simulation circuit is made up of the armature circuit torque coefficient 23A, backelectromotive force coefficient 25A and moment of inertia. This simulation circuit is different from the actual motor in that it does not contain the load torque $G_R$. In other words, the simulation circuit simulates the no load condition of the actual motor. A signal V equal to the actual motor terminal voltage is applied to the simulation circuit, so that the armature current flowing through the simulation circuit is equal to the acceleration (or deceleration) current Ia corresponding to the actual acceleration or deceleration of the motor. By subtracting this current $I_a$ from the actual armature current I with comparator 28, its output represents the load current.

Figure 3:
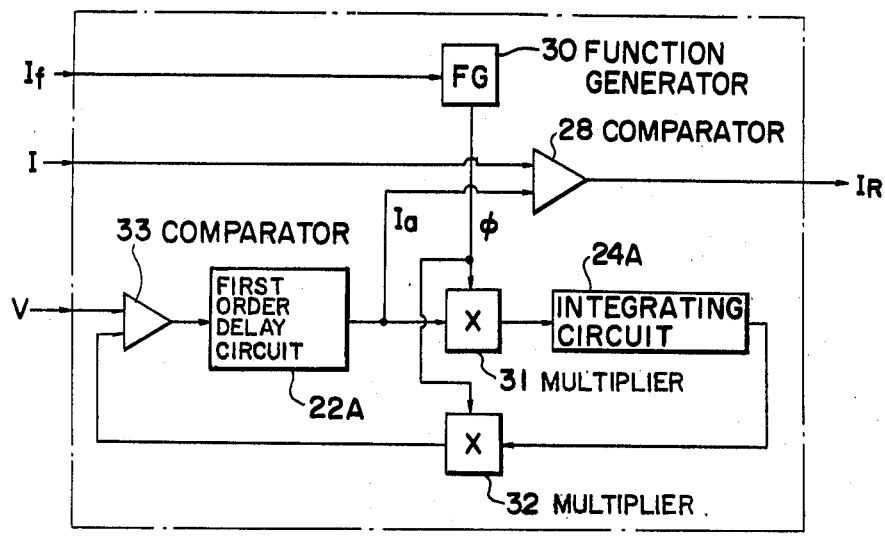
FIGS. 3 and 4 are block diagrams showing modified embodiment of this invention.

FIG. 3 shows a load current detecting apparatus of a DC motor which utilizes a system in which the backelectromotive force coefficient $\Phi$ is determined from the field current $I_f$ by using a function generator 30 generating a function in accordance with the field saturation characteristic. In FIG. 3, a first order delay circuit 22A and an integrating circuit 24A are provided which simulate the armature circuit and the moment of inertia respectively like FIG. 2. There are also provided a function generator 30 which produces the backelectromotive force coefficient $\Phi$ corresponding to the field current $I_f$, the coefficient $\Phi$ being applied to multipliers 31 and 32. The comparator 33 sends the difference between the terminal voltage V and the output from the multiplier 32 to the first order delay circuit 22A. The output thereof corresponds to the acceleration (or deceleration) current $I_a$ and applied to both multiplier 31 and comparator 28. Signal $I_a$ is multiplied with signal $\Phi$ from the function generator 30 by multiplier 31 and the output there is supplied to an integrating circuit 24A. The output signal of the integrating circuit 24A corresponds to the angular speed and is multiplied with the back electromotive force coefficient $\Phi$ in multiplier 32 to produce a back electromotive force signal. The comparator 28 produces a load current $I_R$ corresponding to the difference between the armature current I and the output signal $I_a$ of the first order delay circuit 22A.

As above described, a system for detecting the back-electromotive force coefficient from the field current $I_f$ through the function generator neglects the effect of the armature current (i.e. the armature reaction) and the hysteresis phenomenon of the field so that the result is erroneous. Accordingly, in a situation where the armature reaction and the hysteresis cannot be neglected it is necessary to determine the backelectromotive force coefficient by another method.

In a DC motor, there is the following relationship between the terminal voltage V and the backelectromotive force $V_c$.

$$V_c = V - (RI + L(dI/dt)) \quad (10)$$

where
R: armature resistance
L: armature reactance.

From equations (8) and (10) the back electromotive force coefficient $\Phi$ can be determined by the following equation:

$$\Phi = k \frac{V - \left(RI + L\frac{dI}{dt}\right)}{N} \quad (11)$$

where k represents a constant.

The backelectromotive force coefficient $\Phi$ thus determined contains the effects of the armature reaction and the hysteresis so that it is possible to detect $\Phi$ at high accuracies.

Figure 4:
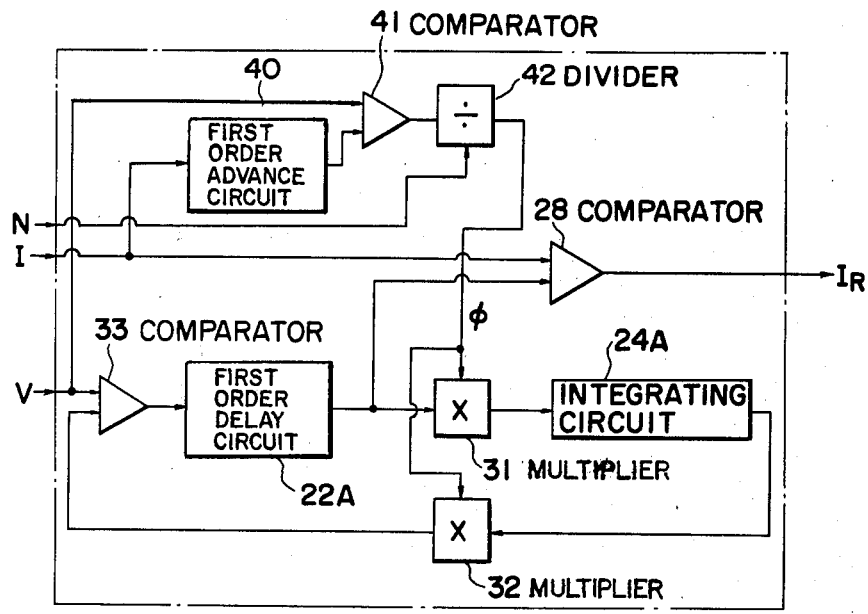

FIG. 4 shows a load current detecting apparatus of a DC motor which uses a system in which the back electromotive force coefficient is calculated according to equation (11) by using the terminal voltage V, the armature current I, and speed N, in which 22A and 24A represent respectively a first order delay circuit simulating the armature circuit and the moment of inertia, and an integrating circuit. A first order advance circuit 40 is provided to calculate the armature voltage drop from the armature current, and an comparator 41 produces a difference between the terminal voltage V and the output of the first order advance circuit 40. In a divider 42, the output of the comparator 41 is divided by the speed N to obtain the back electromotive force coefficient $\Phi$ which is applied to multipliers 31 and 32 meaning that the back electromotive force coefficient $\Phi$ is calculated according to equation (11). A comparator 33 sends the difference between the terminal voltage V and the output of the multiplier 32 to the first order delay circuit 22A. The output signal of the first order delay circuit 22A corresponds to the acceleration (or deceleration) current $I_a$ and applied to multiplier 31 and comparator 28. In the former, this output signal is multiplied with the signal $\Phi$ from the divider 42 and the product is supplied to integrating circuit 24A and the output thereof corresponds to the rotational angular speed and multiplied with the back electromotive force coefficient in the multiplier 32. Comparator 28 produces a difference signal between the armature current I and the output signal $I_a$ of the first order delay circuit 22A.

Figure 1:
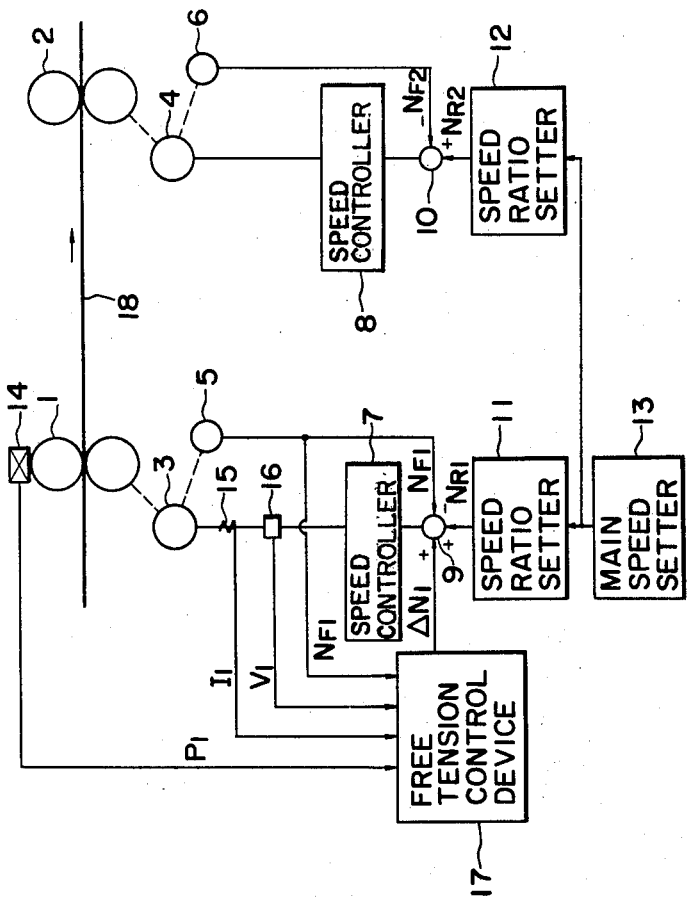
FIG. 1 is a block diagram showing the construction of a conventional free tension control device.
Figure 5:
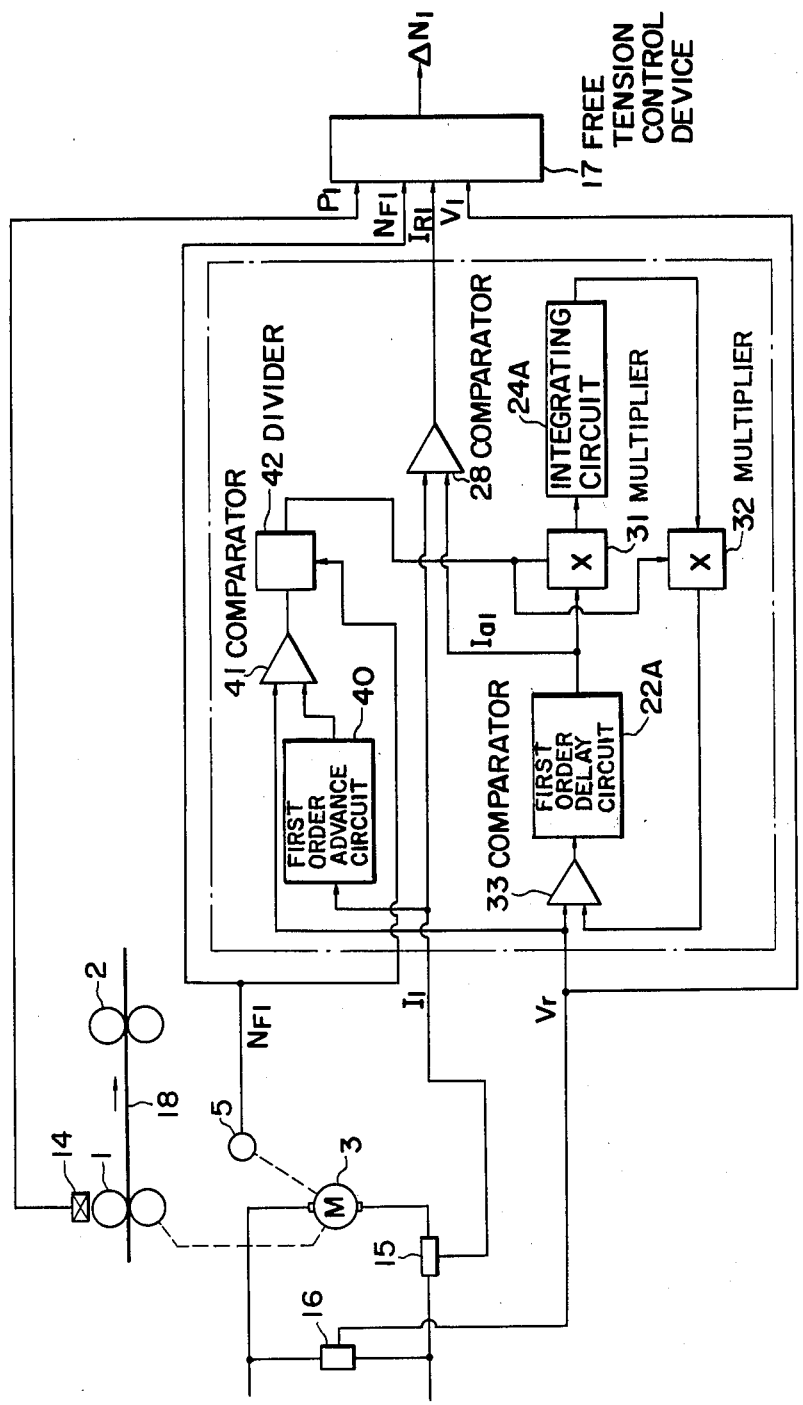
FIG. 5 is a block diagram showing a free tension control device utilizing the load current detecting apparatus shown in FIG. 4.

FIG. 5 shows application of the load current detection device shown in FIG. 4 to a free tension control device. Similar to FIG. 1, the material 18 is rolled by first and second stands and the interstand tension between the first and second stands is controlled by controlling the speed of a DC motor for driving the first stand. The load current detecting apparatus of the DC motor embodying the invention is bounded by dot and dash lines. To this apparatus are applied a speed signal $NF_1$ of the motor detected by a speed detector 5, an armature current signal $I_1$ of the motor 3 detected by a current detector 15, and a terminal voltage signal $V_r$ of the motor 3 detected by a voltage detector 16 to arithmetically operate load current $IR_1$ which is supplied to the free tension control device 17.

In addition to the signal $IR_1$, signals $NF_1$ $V_1$ and a rolling load signal $P_1$ detected by a load detector 14 are also applied to the free tension control device 17. By using these, signals the free tension control device 17 calculates the speed correction quantity $\Delta N_1$ of the first stand.

In FIG. 5, instead of using the load current detecting device shown in FIG. 4, that shown in FIG. 3 can also be used.

As above described, the invention provides a load current detection apparatus of a DC motor in which signals representing the actual armature current, the armature voltage and the speed of the motor are applied to an equivalent simulation circuit of the motor which is prepared by taking into consideration the moment of inertia of the load so as to produce an effective load driving armature current from which acceleration or deceleration current has been subtracted.

What is claimed is:

1. Load current detecting apparatus of a direct current motor for driving a load comprising a load current detector including a simulation circuit representing a no load state of said motor, said similation circuit including a first circuit element representing an armature circuit of said motor and a second circuit element connected to said first circuit element and representing a counter electromotive force coefficient of said motor; means for applying to said first circuit element a signal representing terminal voltage of said motor so as to produce an acceleration or deceleration current of said motor; a comparator for comparing actual armature current of said motor with said acceleration or deceleration current to obtain a load current signal; and means responsive to said load current signal for controlling speed of said motor.

2. The load current detecting apparatus according to claim 1, wherein said simulation circuit comprises a function generator which produces a function representing backelectromotive force of said motor in accordance with field current of the motor; a first multiplier; a first comparator which compares terminal voltage of the motor with the output of said first multiplier; a first order delay circuit supplied with the output of said first comparator and simulating said armature circuit; a second multiplier for multiplying said function with the output of said first order delay circuit; an integrator for integrating an output of said second multiplier to simulate said moment of inertia; means to apply said function and an output of said integrator to said first multiplier; and a second comparator for comparing load current of said motor with the output of said first order circuit.

3. The load current detecting apparatus according to claim 2 wherein said function generator comprises a first order advance circuit which calculates armature voltage drop, a third comparator which compares the output of said first order advance circuit with the terminal voltage of said motor, and a divider which divides the output of said third comparator by a speed of said motor thus producing said function representing back-electromotive coefficient.

4. The load current detecting apparatus according to claim 1, wherein said simulation circuit further comprises a circuit element representing an armature circuit torque coefficient.

* * * * *